Nov. 29, 1966 H. C. JOSEPHS 3,289,119
SEMICONDUCTOR APPARATUS PROVIDING INDUCTIVE REACTANCE
Filed May 6, 1965
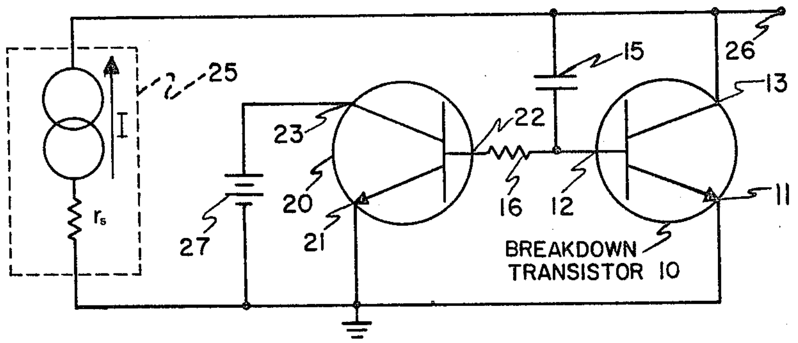
INVENTOR.
HAROLD C. JOSEPHS
BY Omund R. Dahle
ATTORNEY

United States Patent Office 3,289,119

Patented Nov. 29, 1966

3,289,119

SEMICONDUCTOR APPARATUS PROVIDING INDUCTIVE REACTANCE

Harold C. Josephs, Plymouth, Minn., assignor to Honeywell Inc., Minneapolis, Minn., a corporation of Delaware

Filed May 6, 1965, Ser. No. 453,652
5 Claims. (Cl. 333—80)

The present invention relates to a semiconductor apparatus, and, more particularly, to an apparatus for achieving a two terminal inductive reactance without coils.

Solid state designers have long sought solid state equivalents for inductance. The search has been intensified with the development of integrated circuitry. Special devices have been proposed as substitutes for coils, but have generally proved unsatisfactory. This invention provides a novel high Q, high valued, inductive impedance without coils. (Q is defined as the ratio of inductive impedance to series resistance in an inductor.)

A semiconductor device can break down in several different ways. Diode or avalanche breakdown occurs when the elecetric field at the junction is high enough so that any carrier caught in the field is accelerated to an energy such that it can create another hole-electron pair. The newly created pairs are also accelerated sufficiently to create more pairs, and the avalanche multiplication process continues until the carrier density is essentially infinite. In common emitter breakdown, the multiplication process is important but need only be very small rather than infinite. Only a few percent extra carriers are generated.

The common emitter current gain of a transistor is:

$$\beta=\frac{\alpha}{1-\alpha}$$

where $\alpha$ is the fraction of the carriers, injected at the emitter which reach the collector. The quantity $1-\alpha$ is then the fraction of carriers lost and which do not reach the collector. The carrier current lost is $(1-\alpha)i_e$, where $i_e$ is the emitter current. When a small multiplication is present at the collector junction, extra carriers are generated. If those extra carriers replace the carriers lost, then $1-\alpha$ goes to zero, the current gain goes to infinity, and the transistor is said to be operating in the common emitter (or $\alpha=1$) breakdown mode. Common emitter breakdown normally occurs at collector voltages much less than the avalanche breakdown voltages. When the transistor operates in the common emitter breakdown mode, it can easily be seen that the collector voltage is substantially independent of the collector-emitter current.

For an NPN transistor the base current $i_b$ is defined as positive when flowing into the base. Emitter current $i_e$ is positive when it flows out of the emitter, and collector current $i_c$ is positive when it flows into the collector. In other words, normal positive base-emitter current is from base to emitter. $\alpha$ is then defined as the ratio of collector current to emitter current $(i_c/i_e)$, and $1-\alpha$ is the ratio of base current to emitter current $(i_b/i_e)$. In PNP transistors the current directions are reversed, but the ratios are the same. The impedance between the emitter and collector is then defined by the equation:

$$z=\frac{r_e(1+\omega^2 r_c^2 c_c^2)+r_c(1-\alpha)}{1+\omega^2 r_e^2 c_c^2}-\frac{j\omega c_c r_c^2(1-\alpha)}{1+\omega^2 r_c^2 c_c^2}$$

where $\omega$ is the operating frequency, $r_e$ is the dynamic resistance of the emitter junction, $r_c$ is the dynamic resistance of the collector junction, and $c_c$ is the equivalent capacitance between the base and the collector. When an external capacitor is connected between collector and base, $c_c$ is the sum of the collector junction capacitance and the parallel capacitance. Inspection of the above equation reveals that for $\omega r_c c_c$ less than unity, the impedance is inductive when $\alpha$ exceeds unity. When $\alpha$ is greater than unity, $1-\alpha$ is negative and the base current $i_b$ is negative.

The invention utilizes a three electrode semiconductor device operable in the common emitter breakdown mode and having an interelectrode capacitance appearing between the collector and base electrodes. A second three terminal semiconductor device has its base electrically connected to the base of the first device, and its emitter connected to the emitter of the first device. The second device has a relatively small source of potential connected between its emitter and collector. A source of electrical energy, of sufficient magnitude to cause the first device to operate in the common emitter breakdown mode, is connected between the emitter and collector of that device. The impedance appearing between the emitter and collector of the first device is inductive. This inductive impedance is greatly increased by connecting an external capacitor across the collector-base junction of the first device. The circuit of the invention is advantageous in that it can easily be constructed in semiconductive integrated form. The major reason for this is that the common emitter breakdown voltages of the first and second three terminal devices can be identical.

The invention may be more fully understood when taken in conjunction with the following detailed description and the single drawing showing a schematic circuit diagram of the improved inductive apparatus.

In the single drawing, a first three terminal semi-conductor device, shown as transistor 10, has an emitter 11, a base 12, and a collector 13. Energy storage means, here shown as capacitor 15, are connected between base 12 and collector 13. As second three terminal semiconductor device, shown as transistor 20, has an emitter 21, a base 22 and a collector 23. A resistor 16 is connected between base 22 and base 12. Emitter 21 is connected to emitter 11 and to a point of reference, here shown as ground. A source of electrical energy, shown as constant current source 25, having a magnitude sufficient to cause transistor 10 to operate in the common emitter breakdown mode, is connected between emitter 11 and collector 13. An output terminal 26 is connected to collector 13. A second source of electrical energy, shown as battery 27, is connected between emitter 21 and collector 23. Battery 27 has a relatively small magnitude, for example, 1½ volts. For ease in constructing the circuit in semiconductor integrated form, transistors 10 and 20 can have identical common emitter breakdown voltages. However, identical breakdown voltages are not required for proper operation of the circuit. Only transistor 10 operates in the common emitter breakdown mode. Since transistor 10 has inherent junction capacitance in the collector-base junction, capacitor 15 is not required for circuit operation. The addition of capacitor 15 substantially increases the observable inductance. Resistor 16 is not essential to the proper operation of the circuit; therefore, as an alternate arrangement, bases 12 and 22 may be directly connected.

The circuit of the invention provides inductive impedance between terminal 26 and ground. The previously described equation for impedance described the impedance observable between terminal 26 and ground. When the equation is applied to the figure, $c_c$ is the sum of the collector junction capacitance and the capacitance of capacitor 15. Transistor 20 is connected so that some of the majority carriers created by the multiplication process near the collector junction in transistor 10 drift to the base contact instead of the emitter junction. This arrangement provides a negative or reverse base current and allows the total $\alpha$ to exceed unity, i.e., the collector current is greater than the emitter current. An advantage of this circuit is that a relatively high current is obtained through the device in parallel with the emitter-base junction of transistor 10 without a large drain on the multiplication current produced in transistor 10. The use of battery 27 as a separate supply source for transistor 20 allows circuit operation with relatively low power dissipation.

It should readily be seen that the above described embodiment is merely illustrative of the invention. Modifications will be readily apparent to those skilled in the art. For example, the conductivity types of the emitter, base and collector regions of the semiconductor devices may be reversed when accompanied by a reversal of current directions and potential polarities. The invention is therefore not intended to be limited by the described embodiment, but only by the scope of the appended claims.

I claim:

1. A semiconductor apparatus for providing two terminal inductive reactance without coils comprising:
- a breakdown transistor having a first emitter, a first base, and a first collector, and operable in a common emitter breakdown mode;
- a second transistor having a second emitter, a second base, and a second collector, the second emitter being connected to the first emitter;
- a capacitor connected between the first collector and the first base;
- a resistor connected between the first base and the second base;
- means for connecting the first emitter and first collector across a substantially constant current source having sufficient magnitude to cause the breakdown transistor to operate in the common emitter breakdown mode; and
- means for connecting the second emitter and second collector across a source of potential having a relatively low magnitude so that the impedance between the first emitter and first collector is inductive and the circuit dissipates a relatively small amount of power.

2. A semiconductor apparatus according to claim 1 wherein the breakdown transistor and the second transistor have substantially identical common emitter breakdown voltages.

3. A semidconductor inductive apparatus comprising:
- semiconductor means having a first emitter, a first base, and a first collector, and operable in a common emitter breakdown mode, the semiconductor means exhibiting an interelectrode capacitance between the collector and the base;
- further semiconductor means having a second emitter, a second base, and a second collector;
- circiut means connecting the first base to the second base;
- further circuit means connecting the first emitter to the second emitter;
- means for connecting the first emitter and first collector across a first source of electrical energy having sufficient magnitude to cause the semiconductor means to operate in the common emitter breakdown mode; and
- means for connecting the second emitter and second collector across a second source of electrical energy having a magnitude less than that of the first source so that the impedance between the first emitter and first collector is inductive.

4. A semiconductor apparatus according to claim 3 wherein the semiconductor means is a first transistor and the further semiconductor means is a second transistor.

5. A semiconductor apparatus according to claim 3 and additionally having charge storage means connected between the first collector and the first base.

References Cited by the Examiner

Nishizawa et al., Semiconductor Inductance Diode, 1960 International Solid-State Circuits Conference, Digit of Technical Papers, Feb. 12, 1960, pp. 84 and 85 relied on.

HERMAN KARL SAALBACH, *Primary Examiner.*

R. F. HUNT, *Assistant Examiner.*